(12) United States Patent
Matsumoto et al.

(10) Patent No.: US 10,315,354 B2
(45) Date of Patent: Jun. 11, 2019

(54) IMPRINT APPARATUS AND METHOD OF MANUFACTURING ARTICLE

(71) Applicant: CANON KABUSHIKI KAISHA, Tokyo (JP)

(72) Inventors: Hideki Matsumoto, Utsunomiya (JP); Tomonobu Saku, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/902,359

(22) PCT Filed: Mar. 10, 2015

(86) PCT No.: PCT/JP2015/057608
§ 371 (c)(1),
(2) Date: Dec. 31, 2015

(87) PCT Pub. No.: WO2015/141604
PCT Pub. Date: Sep. 24, 2015

(65) Prior Publication Data
US 2016/0375627 A1    Dec. 29, 2016

(30) Foreign Application Priority Data

Mar. 17, 2014  (JP) .................................. 2014-053981

(51) Int. Cl.
*G03F 7/00* (2006.01)
*B29C 43/02* (2006.01)
(Continued)

(52) U.S. Cl.
CPC .......... *B29C 59/026* (2013.01); *B29C 31/008* (2013.01); *B29C 43/56* (2013.01);
(Continued)

(58) Field of Classification Search
None
See application file for complete search history.

(56) References Cited

U.S. PATENT DOCUMENTS

2005/0072755 A1    4/2005  McMackin et al.
2007/0063384 A1*   3/2007  Choi ..................... B82Y 10/00
                                                        264/319
(Continued)

FOREIGN PATENT DOCUMENTS

CN          1859959 A      11/2006
JP        2004103817 A      4/2004
(Continued)

OTHER PUBLICATIONS

International Search Report issued in PCT/JP2015/057608, dated Jun. 9, 2015. Form PCT/ISA/210 and 220.
(Continued)

*Primary Examiner* — Binu Thomas
(74) *Attorney, Agent, or Firm* — Rossi, Kimms & McDowell LLP

(57) ABSTRACT

An imprint apparatus includes a nozzle including a discharge outlet which discharges imprint material onto the substrate, a supply unit configured to supply a gas which accelerates filling of a pattern of a mold with the imprint material, and a gas unit provided with the nozzle. The gas unit performs gas supply or exhaust with respect to a second space around a first space between the nozzle and a portion of the substrate which faces the nozzle and is conveyed under the nozzle in order to suppress the gas from flowing into the first space.

13 Claims, 2 Drawing Sheets

(51) Int. Cl.

| | |
|---|---|
| *B29C 43/56* | (2006.01) |
| *B29C 59/02* | (2006.01) |
| *H01L 21/683* | (2006.01) |
| *G11B 5/855* | (2006.01) |
| *B29C 31/00* | (2006.01) |
| *B29C 59/00* | (2006.01) |
| *H01L 21/67* | (2006.01) |
| *B82Y 40/00* | (2011.01) |

(52) U.S. Cl.
CPC .......... *B29C 59/002* (2013.01); *G03F 7/0002* (2013.01); *G11B 5/855* (2013.01); *H01L 21/6715* (2013.01); *H01L 21/6838* (2013.01); *B29C 43/021* (2013.01); *B29C 59/022* (2013.01); *B82Y 40/00* (2013.01)

(56) References Cited

U.S. PATENT DOCUMENTS

| | | | | |
|---|---|---|---|---|
| 2008/0048056 A1* | 2/2008 | Pichler | ............... | H01L 21/6708 239/549 |
| 2008/0296269 A1* | 12/2008 | Sato | ............... | C23C 8/10 219/121.46 |
| 2010/0096764 A1* | 4/2010 | Lu | ............... | G03F 7/0002 264/39 |
| 2011/0018167 A1* | 1/2011 | Koole | ............... | B82Y 10/00 264/293 |
| 2011/0273684 A1 | 11/2011 | Owa et al. | | |
| 2012/0164841 A1* | 6/2012 | Kelekar | ............... | B05C 5/00 438/758 |
| 2012/0199997 A1* | 8/2012 | Tanabe | ............... | B82Y 40/00 264/82 |
| 2013/0241096 A1* | 9/2013 | Shudo | ............... | B82Y 10/00 264/40.5 |
| 2013/0320589 A1 | 12/2013 | Fujita | | |

FOREIGN PATENT DOCUMENTS

| | | |
|---|---|---|
| JP | 3700001 B2 | 9/2005 |
| JP | 2011096766 A | 5/2011 |
| JP | 2012174809 A | 9/2012 |
| JP | 2013229448 A | 11/2013 |
| JP | 5364533 B2 | 12/2013 |
| KR | 1020130135773 A | 12/2013 |
| WO | 2013035761 A1 | 3/2013 |

OTHER PUBLICATIONS

Written Opinion issued in PCT/JP2015/057608, dated Jun. 9, 2015. Form PCT/ISA/237.

Office Action issued in Korean Appln. No. 10-2016-7008106, dated Nov. 9, 2016.

Office Action issued in Chinese Appln No. 201580012912.3 dated May 3, 2018. English Translation provided.

* cited by examiner

IMPRINT APPARATUS AND METHOD OF MANUFACTURING ARTICLE

TECHNICAL FIELD

The present invention relates to an imprint apparatus and a method of manufacturing an article.

BACKGROUND ART

In the manufacturing process of a semiconductor device or the like, an imprint apparatus using an imprint technique has received attention as a lithography apparatus substituted for an exposure apparatus such as a stepper or a scanner. The imprint apparatus forms (transfers) a pattern on a substrate by performing an imprint process including a coating step, an imprinting step, a curing step, and a separating step. In the coating step, a resin (resist) is applied on the substrate. In the imprinting step, the resin on the substrate and a mold on which a fine three-dimensional pattern has been formed are brought into contact with each other, and the three-dimensional pattern (concave portion) which has been formed on the mold is filled with the resin. In the curing step, the resin is cured while the mold and the resin on the substrate are in contact with each other. In the separating step, the mold is released from the cured resin on the substrate.

In the imprint apparatus, bubbles may remain in the three-dimensional pattern (concave portion) on the mold in the imprinting step. In this case, a failure (unfilling defect) may occur in a pattern to be formed on the substrate, thus making it impossible to form an accurate pattern on the substrate. Although the bubbles remaining in the three-dimensional pattern on the mold will disappear as time goes by, much time is required.

In order to prevent a decrease in a throughput (productivity), Japanese Patent No. 3700001 proposes an imprint apparatus for performing an imprinting step and a separating step in the atmosphere of a condensable gas which condenses and is liquefied along with a pressure increase when a mold and a resin on a substrate are pressed against each other.

In the imprint apparatus, a resin supply unit which supplies (applies) the resin on the substrate and an imprint unit which brings the resin on the substrate into contact with the mold are generally arranged close to each other from the viewpoints of the occupation area and the throughput of the apparatus. Therefore, the condensable gas used in the imprinting step and the separating step (that is, a gas which accelerates filling with the resin) may flow into a space where the resin supply unit is arranged (in a resin supply environment). If there is an inflow of the condensable gas to the resin supply environment, the resin cannot be supplied properly and unevenness occurs in the resin supplied onto the substrate. In this case, a portion may appear where the three-dimensional pattern on the mold is not sufficiently filled with the resin and an unfilling defect may occur in the pattern to be formed on the substrate.

SUMMARY OF INVENTION

The present invention provides an imprint apparatus advantageous in reducing unevenness of an imprint material to be supplied onto a substrate.

According to one aspect of the present invention, there is provided an imprint apparatus which molds an imprint material on a substrate using a mold to form a pattern on the substrate, the apparatus including a nozzle including a discharge outlet which discharges the imprint material onto the substrate, a holding unit configured to hold the mold, a supply unit configured to supply a gas which accelerates filling of a pattern of the mold with the imprint material to a portion between the holding unit and the imprint material on the substrate, and a gas unit provided with the nozzle, wherein the gas unit performs gas supply or exhaust with respect to a second space around a first space between the nozzle and a portion of the substrate which faces the nozzle and is conveyed under the nozzle in order to suppress the gas from flowing into the first space.

Further aspects of the present invention will become apparent from the following description of exemplary embodiments with reference to the attached drawings.

DESCRIPTION OF EMBODIMENTS

Figure 1:
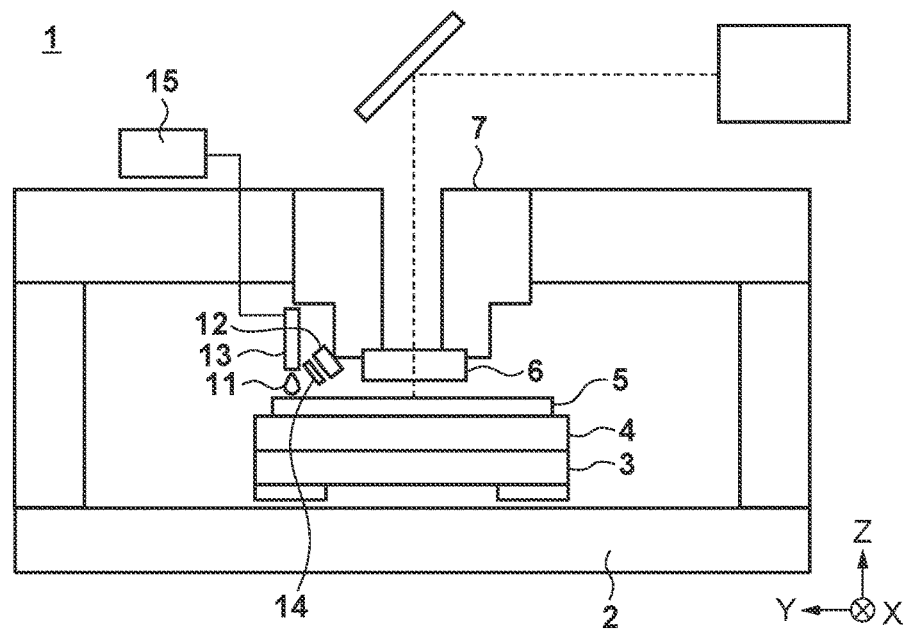
FIG. 1 is a schematic view showing the arrangement of an imprint apparatus according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 1 according to one aspect of the present invention. The imprint apparatus 1 is a lithography apparatus which is used for the manufacturing process of a semiconductor device or the like, and molds an imprint material on a substrate using a mold to form a pattern on the substrate. In this embodiment, the imprint apparatus 1 uses a resin as the imprint material and adopts, as a curing method of the resin, a photo-curing method of curing the resin by irradiation with ultraviolet light (UV light).

The imprint apparatus 1 includes a platen 2, a substrate stage 3, a substrate chuck 4, an imprint head 7, a gas supply unit 12, a resin supply unit 13, a gas recovery unit 14, and a control unit 15. The control unit 15 includes a CPU and a memory, and controls the whole (operation) of the imprint apparatus 1.

The substrate stage 3 is arranged on the platen 2 to be movable within a horizontal plane (X-Y plane). The substrate stage 3 supports the substrate chuck 4. The substrate chuck 4 holds (vacuum-chucks) a substrate 5. The imprint head 7 functions as a holding unit which holds a mold 6 and moves the mold 6 in a vertical direction (Z direction), thereby bringing the mold 6 and a resin 11 on the substrate into contact with each other (imprinting) or releasing (separating) the mold 6 from the resin 11 on the substrate. Note that imprinting or separating may be performed by moving not the mold 6 but the substrate 5 (substrate stage 3) or the mold 6 and the substrate 5 in the vertical direction.

Figure 2:
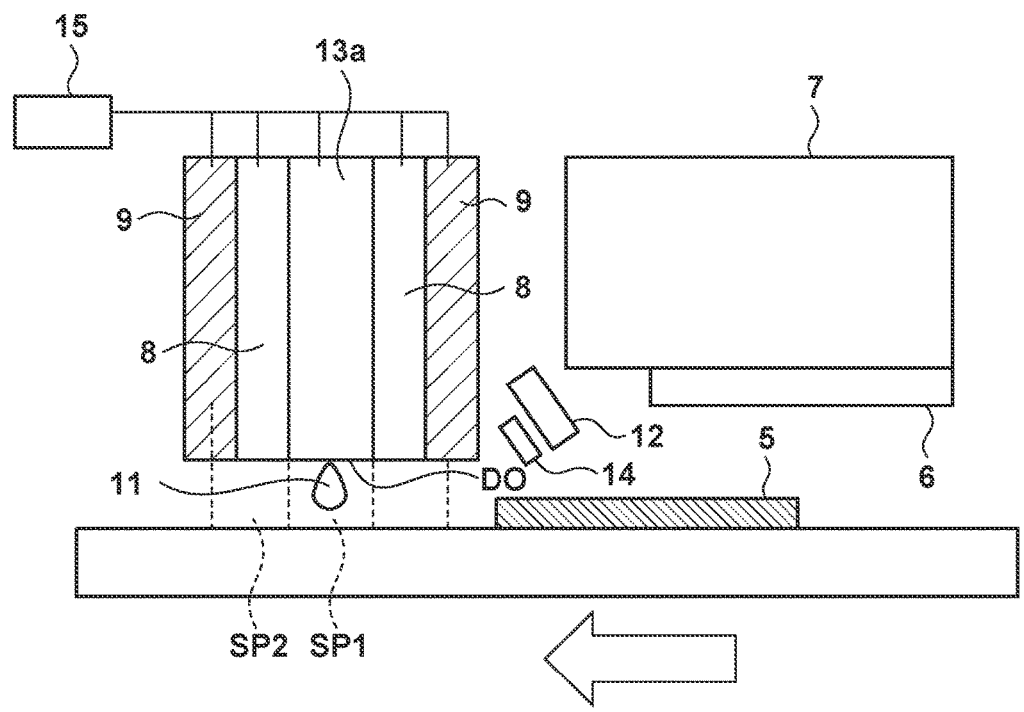
FIG. 2 is a schematic view showing the neighborhood of a nozzle and gas units of the imprint apparatus shown in FIG. 1.

As shown in FIG. 2, the resin supply unit 13 includes a nozzle 13a including a discharge outlet DO which discharges the resin 11 onto the substrate 5. The resin supply unit 13 supplies (applies) the resin 11 to the portion (planned application region) of the substrate 5 which faces the nozzle 13a and is conveyed under the nozzle 13a by the substrate stage 3. The substrate stage 3 conveys the substrate 5, onto which the resin 11 has been supplied by the resin supply unit 13, under the mold 6 (pattern thereof) held by the imprint head 7.

The gas supply unit 12 is arranged, for example, between the resin supply unit 13 and the imprint head 7. The gas supply unit 12 supplies a gas which accelerates the filling of the mold 6 (pattern thereof) with the resin 11 to a portion between the resin 11 on the substrate and the imprint head 7 (the mold 6 held by the imprint heads 7). The gas supply unit 12 supplies, for example, a condensable gas which condenses and is liquefied along with a pressure increase when the mold 6 and the resin 11 on the substrate are pressed against each other. In this embodiment, the gas supply unit 12 supplies pentafluoropropane serving as the condensable gas.

The gas recovery unit 14 is arranged close to the gas supply unit 12. The gas recovery unit 14 includes, for example, a vacuum pump or a suction apparatus, and recovers the gas (condensable gas) that has been supplied to the portion between the imprint head 7 and the resin 11 on the substrate from the gas supply unit 12.

In the imprint apparatus 1, the gas supply unit 12 supplies (fills with) the condensable gas to the portion between the mold 6 and the resin 11 on the substrate when the substrate 5 onto which the resin 11 has been supplied is positioned under the mold 6. When the condensable gas fills the portion between the mold 6 and the resin 11 on the substrate, the mold 6 and the resin 11 on the substrate are brought into contact with each other, and the resin 11 is irradiated with ultraviolet light via the mold 6, thereby curing the resin 11. Then, the pattern of the mold 6 is formed on the substrate 5 by releasing the mold 6 from the cured resin 11 on the substrate.

The present inventor has found out that the condensable gas, pentafluoropropane in this embodiment, supplied to the portion between the mold 6 and the resin 11 on the substrate has various effects on the resin 11. More specifically, it has been found by an experiment that the viscosity of the resin 11 changes by about 50% and the surface tension of the resin 11 changes by about 10% (that is, the physical property value of the resin 11 changes) in a pentafluoropropane atmosphere as compared to an air atmosphere.

Therefore, if the resin supply unit 13 supplies the resin 11 onto the substrate 5 in this condensable gas atmosphere, the resin 11 cannot be supplied properly due to the change in the physical property value of the resin 11 and unevenness occurs in the resin 11 supplied onto the substrate.

To prevent this, in this embodiment, the nozzle 13a of the resin supply unit 13 includes gas (supply/exhaust) units 8 and detection units 9, as shown in FIG. 2. Each gas unit 8 has a function of suppressing the remaining condensable gas that was not recovered by the gas recovery unit 14 from flowing under the nozzle 13a, that is, into a first space SP1 between the nozzle 13a and the portion of the substrate 5 which faces the nozzle 13a and is conveyed under the nozzle 13a. In this embodiment, each gas unit 8 suppresses the condensable gas from flowing into the first space SP1 by supplying or exhausting gas on a second space SP2 around the first space SP1 and isolating the atmosphere of the first space SP1.

Each detection unit 9 is arranged, for example, adjacent to the corresponding gas unit 8 and detects the presence or absence and the concentration of the condensable gas flowing into the second space SP2. Any arrangement known in the art such as a sensor which detects the condensable gas using a change in a refractive index can be applied to each detection unit 9. In this embodiment, each detection unit 9 detects the presence or absence of the condensable gas using a sensor which measures an oxygen ratio.

In this embodiment, each gas unit 8 does not constantly supply or exhaust gas but, as will be described later, starts supplying or exhausting gas when the detection unit 9 detects the condensable gas. However, each gas unit 8 may be configured to constantly supply or exhaust gas regardless of a detection result by the detection unit 9. The control unit 15 controls the amount of gas supplied or exhausted by each gas unit 8. The control unit 15 can increase or decrease the gas supply amount or the gas exhaust amount.

In this embodiment, the gas units 8 and the detection units 9 are provided to sandwich the nozzle 13a with respect to the conveyance direction of the substrate 5. However, they may only be provided on an imprint head side. The gas units 8 may also be provided to surround the nozzle 13a (that is, a space to supply or exhaust gas surrounds the first space SP1). Furthermore, the positional relationship between the gas units 8 and the detection units 9 may be reversed with respect to the nozzle 13a.

Figure 3:
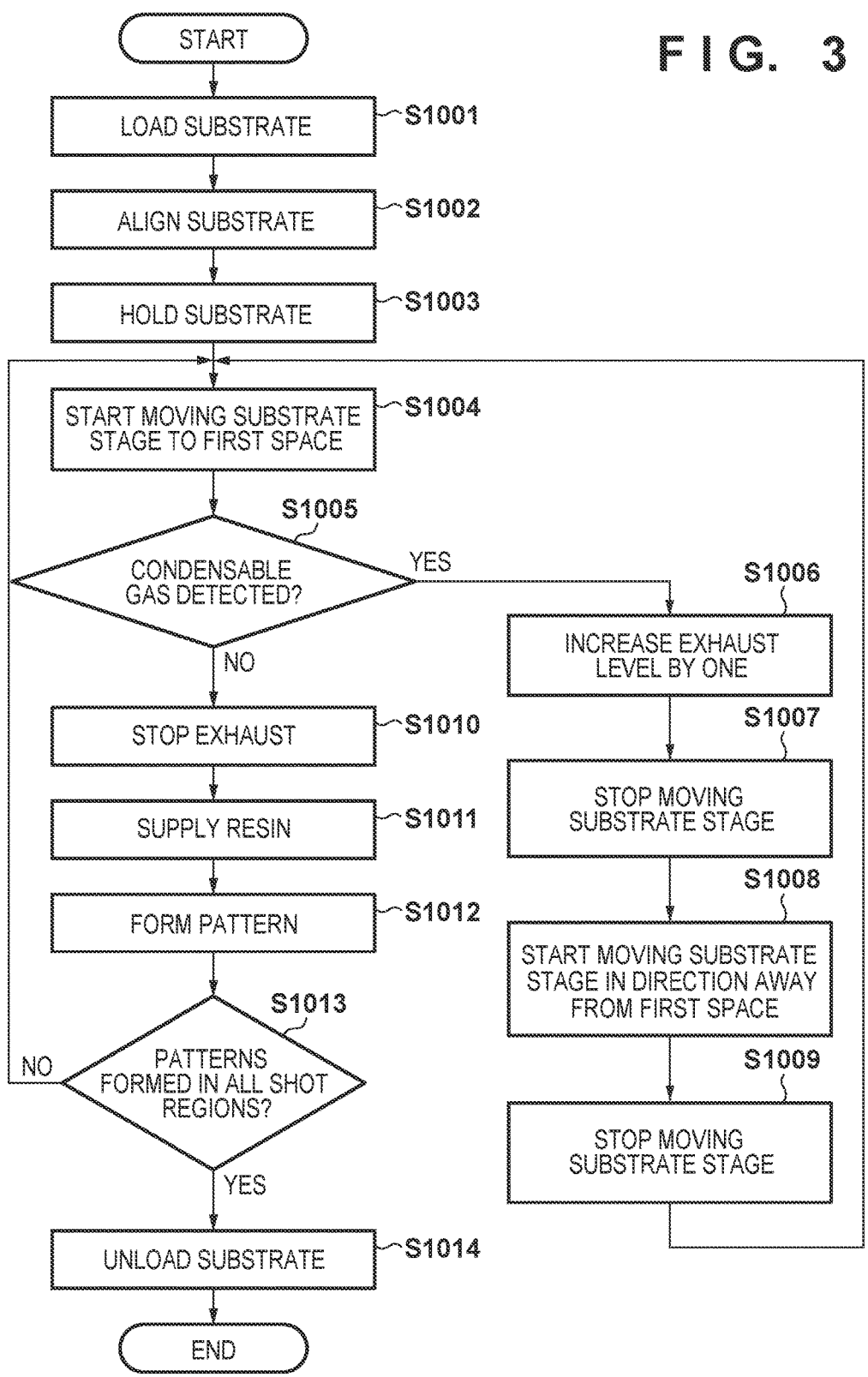
FIG. 3 is a flowchart for explaining an imprint process in the imprint apparatus shown in FIG. 1.

An imprint process in the imprint apparatus 1 will be described with reference to FIG. 3. The control unit 15 comprehensively controls the respective units of the imprint apparatus 1, thereby performing the imprint process. Further, it is assumed here that each gas unit 8 performs exhaust from the second space SP2.

In step S1001, a substrate conveyance mechanism (not shown) loads the substrate 5 into the imprint apparatus 1 from outside the imprint apparatus 1. In step S1002, the substrate 5 loaded into the imprint apparatus 1 is conveyed to an alignment mechanism and then alignment of the substrate 5 is performed for conveying the substrate 5 to the substrate stage 3.

In step S1003, the substrate 5 which has undergone the alignment is conveyed to the substrate chuck 4 and the substrate chuck 4 holds the substrate 5. In step S1004, the substrate stage 3 starts moving to be under the resin supply unit 13 (nozzle 13a), that is, the first space SP1 in order to supply the resin 11 to the target shot region (the shot region where the imprint process is to be performed) of the substrate 5. Also, along with the start of the movement of the substrate stage 3, each detection unit 9 detects the condensable gas flowing into the first space SP1 (that is, detects the presence or absence and the concentration of the condensable gas in the second space SP2).

In step S1005, it is determined whether each detection unit 9 detects the condensable gas. If each detection unit 9 detects the condensable gas, the process advances to step S1006. If each detection unit 9 does not detect the condensable gas, the process advances to step S1010.

In step S1006, a level of gas exhausted by each gas unit 8 in the second space SP2 is increased by one. The gas exhaust level indicates the amount of gas exhausted by each gas unit 8 and gets lower as the gas exhaust amount decreases, and vice versa. In other words, in step S1006, the amount of gas exhausted by each gas unit 8 on the second space SP2 is increased. Note that if each gas unit 8 has not started exhausting gas of the second space SP2 yet (the gas exhaust level is "0"), the gas unit 8 starts exhausting gas of the second space SP2 in step S1006.

In step S1007, the substrate stage 3 stops moving to the first space SP1. In step S1008, the substrate stage 3 starts moving in the direction in which the substrate stage 3 moves away from the first space SP1 (that is, the movement of the substrate stage 3 is reversed). In step S1009, the substrate stage 3 stops moving at a point in time when the substrate stage 3 has moved by a predetermined distance (for example, under the mold 6) in the direction away from the first space SP1, and the process returns to step S1004.

While each detection unit 9 detects the condensable gas in steps S1004 to S1009, the amount of exhaust performed by each gas unit 8 on the second space SP2 increases gradually. In this embodiment, the substrate stage 3 stops moving to the first space SP1 (step S1007) after the level of exhaust performed by each gas unit 8 in the second space SP2 increases by one (step S1006). However, the level of exhaust performed by each gas unit 8 in the second space SP2 may be increased by one after the substrate stage 3 stops moving to the first space SP1 or they may happen at the same time. Also, instead of gradually increasing the amount of exhaust performed by each gas unit 8 on the second space SP2, the amount of exhaust for the second space SP2 may increase in accordance with the concentration of the condensable gas detected by each detection unit 9 (that is, to the exhaust amount corresponding to the concentration) in step S1006. Note that since the substrate stage 3 does not move to the first space SP1 (the substrate 5 is not conveyed under the nozzle 13a) while each detection unit 9 detects the condensable gas, the resin supply unit 13 (nozzle 13a) stops discharging the resin 11 onto the substrate.

In step S1010, each gas unit 8 stops exhaust for the second space SP2. In step S1011, the resin supply unit 13 (nozzle 13a) supplies the resin 11 to the target shot region of the substrate 5.

In step S1012, the pattern of the mold 6 is formed in the target shot region of the substrate 5 onto which the resin 11 has been supplied. As described above, the target shot region of the substrate 5 is positioned under the mold 6, and the gas supply unit 12 supplies the condensable gas to the portion between the mold 6 and the resin 11. Then, when the condensable gas fills the portion between the mold 6 and the resin 11 on the substrate, the mold 6 and the resin 11 on the substrate are brought into contact with each other, and the resin 11 is irradiated with ultraviolet light via the mold 6, thereby curing the resin 11. Then, the mold 6 is released from the cured resin 11 on the substrate.

In step S1013, it is determined whether patterns are formed in all the shot regions of the substrate 5. If the patterns are not formed in all the shot regions, the process returns to step S1004 in order to form the pattern in the next target shot region. If the patterns are formed in all the shot regions, the process advances to step S1014. In step S1014, the substrate conveyance mechanism unloads the substrate 5 on which the patterns have been formed from the imprint apparatus 1, and then the process ends.

As described above, according to this embodiment, even if the gas which accelerates the filling of the mold 6 with the resin 11 is used, the gas units 8 can suppress the gas from flowing into the portion under the nozzle 13a (the first space SP1). This allows the resin supply unit 13 to supply the resin 11 properly (that is, supply the resin 11 onto the substrate uniformly). Therefore, the imprint apparatus 1 can form an accurate pattern on the substrate without causing any unfilling defect.

In this embodiment, a case in which each gas unit 8 performs exhaust from the second space SP2 has been described. As described above, however, the same effect can also be obtained in a case in which each gas unit 8 performs gas supply to the second space SP2 (that is, forms an air curtain). Furthermore, vaporization heat, a turbulent flow, and the like may occur if each gas unit 8 constantly performs exhaust from the second space SP2 and its exhaust amount increases. If it is possible to suppress them, there is no need to provide the detection units 9.

A method of manufacturing a device (the semiconductor device, a magnetic storage media, a liquid crystal display element, or the like) serving as an article will be described. The manufacturing method includes a step of forming a pattern on a substrate (a wafer, a glass plate, a film-like substrate, or the like) using the imprint apparatus 1. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-053981 filed on Mar. 17, 2014, which is hereby incorporated by reference herein in its entirety.

The invention claimed is:

1. An imprint apparatus which molds an imprint material on a substrate using a mold to form a pattern on the substrate, the apparatus comprising:
    a nozzle including a discharge outlet which discharges the imprint material onto the substrate;
    a mold holder configured to hold the mold;
    a gas supplier configured to supply a gas which accelerates filling of a pattern of the mold with the imprint material to a portion between the mold holder and the imprint material on the substrate; and
    a reduction device provided with the nozzle,
    wherein the reduction device performs gas supply or exhaust with respect to a second space between the reduction device and a portion of the substrate that faces the reduction device in order to reduce an amount of gas, from among the gas that was supplied by the gas supplier to the portion between the mold holder and the imprint material on the substrate, that flows, via the second space, into a first space between the nozzle and a portion of the substrate that faces the nozzle;
    wherein the reduction device is attached to the nozzle.

2. The apparatus according to claim 1, further comprising a detector configured to detect gas supplied by the gas supplier flowing into the second space,
    wherein the reduction device starts the supply or the exhaust when the detector detects the gas supplied by the gas supplier flowing into the second space.

3. The apparatus according to claim 1, further comprising a detector configured to detect gas supplied by the gas supplier flowing into the second space,
    wherein the reduction device increases an amount of the supply or an amount of the exhaust when the detector detects the gas supplied by the gas supplier flowing into the second space.

4. The apparatus according to claim 3, wherein the reduction device increases the amount of the supply or the amount of the exhaust in accordance with a concentration of the gas detected by the detector.

5. The apparatus according to claim 2, further comprising a movable stage configured to hold the substrate; and
a controller configured to control the stage to stop the stage moving to the first space when the detector detects the gas supplied by the gas supplier flowing into the second space.

6. The apparatus according to claim 5, wherein the controller controls the stage to move in a direction in which the stage moves away from the first space after stopping the stage moving to the first space.

7. The apparatus according to claim 2, wherein the nozzle stops discharging the imprint material onto the substrate while the detector detects the gas supplied by the gas supplier flowing into the second space.

8. The apparatus according to claim 1, wherein the reduction device sandwiches the nozzle.

9. The apparatus according to claim 1, further comprising a gas recoverer provided between the mold holder and the reduction device, and configured to recover the gas supplied by the gas supplier.

10. The apparatus according to claim 1, wherein the gas supplied by the gas supplier contains a condensable gas which condenses when the mold and the imprint material on the substrate are pressed against each other.

11. A method of manufacturing an article, the method comprising:
forming a pattern on a substrate using an imprint apparatus; and
processing the substrate on which the pattern has been formed,
wherein the imprint apparatus molds an imprint material on the substrate using a mold to form a pattern on the substrate and includes:
a nozzle including a discharge outlet which discharges the imprint material onto the substrate;
a mold holder configured to hold the mold;
a gas supplier configured to supply a gas which accelerates filling of a pattern of the mold with the imprint material to a portion between the mold holder and the imprint material on the substrate; and
a reduction device provided with the nozzle,
wherein the reduction device performs gas supply or exhaust with respect to a second space between the reduction device and a portion of the substrate that faces the reduction device in order to reduce an amount of gas, from among the gas that was supplied by the gas supplier to the portion between the mold holder and the imprint material on the substrate, that flows, via the second space, into a first space between the nozzle and a portion of the substrate that faces the nozzle;
wherein the reduction device is attached to the nozzle.

12. The apparatus according to claim 1, further comprising a gas recoverer configured to recover the gas supplied by the gas supplier,
wherein the reduction device is spaced apart from the gas supplier that is configured to supply the gas to the portion between the mold holder and the imprint material on the substrate and is spaced apart from the gas recoverer that is configured to recover the gas supplied by the gas supplier.

13. The apparatus according to claim 1, further comprising a gas recoverer configured to recover the gas supplied by the gas supplier,
wherein the reduction device is different from both the gas supplier and the gas recoverer.

* * * * *